United States Patent [19]
Kim et al.

[11] Patent Number: 5,912,857
[45] Date of Patent: Jun. 15, 1999

[54] ROW DECODER FOR SEMICONDUCTOR MEMORY DEVICE

[75] Inventors: Jae-Hyeoung Kim, Seoul; Jae-Seung Choi, Kyoungki-do, both of Rep. of Korea

[73] Assignee: Hyundai Electronics Industries Co., Ltd., Kyoungki-do, Rep. of Korea

[21] Appl. No.: 08/882,196

[22] Filed: Jun. 25, 1997

[30] Foreign Application Priority Data

Jun. 29, 1996 [KR] Rep. of Korea ................. 96-26322

[51] Int. Cl.⁶ ................................................. G11C 8/00
[52] U.S. Cl. ........................ 365/230.06; 365/230.03
[58] Field of Search .................. 365/185.13, 230.06, 365/230.03

[56] References Cited

U.S. PATENT DOCUMENTS

| | | | |
|---|---|---|---|
| 5,043,942 | 8/1991 | Iwata et al. | 365/185.13 |
| 5,295,105 | 3/1994 | Atsumi | 365/185.13 |
| 5,301,144 | 4/1994 | Kohno | 365/104 |
| 5,369,608 | 11/1994 | Lim et al. | 365/185.13 |
| 5,434,814 | 7/1995 | Cho et al. | 365/185.13 |
| 5,463,577 | 10/1995 | Oowaki et al. | 365/230.03 |

*Primary Examiner*—David Nelms
*Assistant Examiner*—M. Tran
*Attorney, Agent, or Firm*—Ware, Fressola, Van Der Sluys & Adolphson LLP

[57] ABSTRACT

A row decoder for a semiconductor memory device having a plurality of cell strings with a plurality of memory cells, is disclosed. The row decoder includes: selection line decoders that respectively correspond to the cell strings, and output a signal for selecting one of the corresponding cell strings; a word line decoder outputting word-line selection signals used for selecting a corresponding memory cell's word line among the memory cells of the selected one of the cell strings; and a plurality of switching circuits that correspond to the cell strings, and transmit each word-line selection signal, outputted from the word line decoder, to a corresponding memory cell of a cell string selected by one selection signal.

4 Claims, 2 Drawing Sheets

ROW DECODER FOR SEMICONDUCTOR MEMORY DEVICE

BACKGROUND OF THE INVENTION

1. Field of the Invention

The present invention relates to a row decoder for a semiconductor memory device, and more particularly, it relates to a row decoder for a semiconductor memory device of high efficiency which can provide both minimal power consumption and high-speed performance.

2. Discussion of Related Art

Row decoders are widely used for memory circuits and various parts, and are of importance in semiconductor devices. Accordingly, it is desirable that they have a power-saving function for minimizing power consumption and at the same time, offer high-speed performance. Research and development efforts have thus been devoted to the fabrication of such row decoders.

Referring to FIG. 1, a conventional row decoder is now described.

The conventional row decoder includes first to eighth selection line decoders, 1 to 8, each having: a pair of four-input NAND gates, NAND11, NAND12 to NAND81, NAND82; a word line decoder 9 having sixteen four-input NAND gates, NAND9-1 to NAND9-16; and eight cell strings ST1 to ST8 receiving output signals SL0, SL1 to SL14, SL15 of each NAND gate, NAND11, 12 to NAND81, and output signals, WL0 to WL15, of each of the NAND gates, NAND9-1 to NAND9-16.

Output signals, SL0, SL1 to SL14, SL15 of the selection line decoders, 1 to 8, are each used for selecting one of corresponding cell strings, ST1 to ST8. Word-line selection signals, WL0 to WL15, are each used for selecting and driving a corresponding memory cell's word line of the memory cells in the cell strings, ST1 to ST8. That is, the four-input NAND gates, NAND11, NAND12 to NAND81, NAND82, each apply an output signal to the first to eighth cell strings, ST1 to ST8, thus selecting one of the first to eighth cell strings, ST1 to ST8. In the meantime, NAND gates, NAND9-1 to NAND9-16, of word line decoder 9 each have output terminals corresponding to the respective input terminals of cell strings, ST1 to ST8, for receiving word-line selection signals WL0 to WL15.

According to the above-described construction, each output signal of the sixteen NAND gates, NAND9-1 to NAND9-16, of the word line decoder 9 actuates word lines of all cell strings, ST1 to ST8, that are selected or not selected by each output signal of four-input NAND gates, NAND11, NAND12 to NAND81, NAND82.

As described above, since one output signal of the word line decoder 9 actuates the word lines of the eight cell strings, a heavy load is applied onto the row decoder, thus retarding the row decoder performance. Furthermore, a buffer of large size must be used in order to increase fan-out, i.e. in order to let the row decoder have a large driving capability, which causes an increase in power consumption.

SUMMARY OF THE INVENTION

Accordingly, the present invention is directed to a row decoder for a semiconductor memory device of high efficiency that substantially obviates one or more of the problems due to limitations and disadvantages of the related art.

An object of the present invention is to provide a row decoder for a semiconductor memory device which can minimize power consumption and assure high-speed performance by reducing a load heavily applied onto the row decoder.

To achieve these and other advantages and in accordance with the purpose of the present invention, as embodied and broadly described, the present invention discloses a row decoder for a semiconductor memory device having a plurality of cell strings with a plurality of memory cells including selection line decoders that each correspond to the cell strings, and output a signal for selecting one of the corresponding cell strings; a word line decoder outputting word-line selection signals, the selection signals being used for selecting a corresponding memory cell's word line among the memory cells of the selected one of the cell strings; and a plurality of switching circuits each corresponding to the cell strings, and transmitting each word-line selection signal, outputted from the word line decoder, to a corresponding memory cell of a cell string selected by one selection signal.

Each of the switching circuits includes control means each producing a control signal on receipt of an output signal of each of selection line decoders; and switching means respectively enabled by control signals of the control means and transmitting word-line selection signals, outputted by the word line decoder, to only the selected cell string among a plurality of cell strings.

Each of the control means includes: a NOR gate for performing a NOR operation with respect to output signals from one of the selection line decoders and for outputting a resultant signal to the switching means as a first control signal; and an inverter for inverting the output signal of the NOR gate and for outputting the inverted signal as a second control signal. Furthermore, each of switching means has a plurality of transmission gates enabled by the first and second control signals, and transmitting each word-line selection signal which is outputted by the word line decoder, to the selected cell string's corresponding memory cell.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate the embodiment of the invention and together with the description serve to explain the principles of the drawings, wherein.

DETAILED DESCRIPTION

Reference will now be made in detail to the preferred embodiments of the present invention, examples of which are illustrated in the accompanying drawings.

Figure 1:
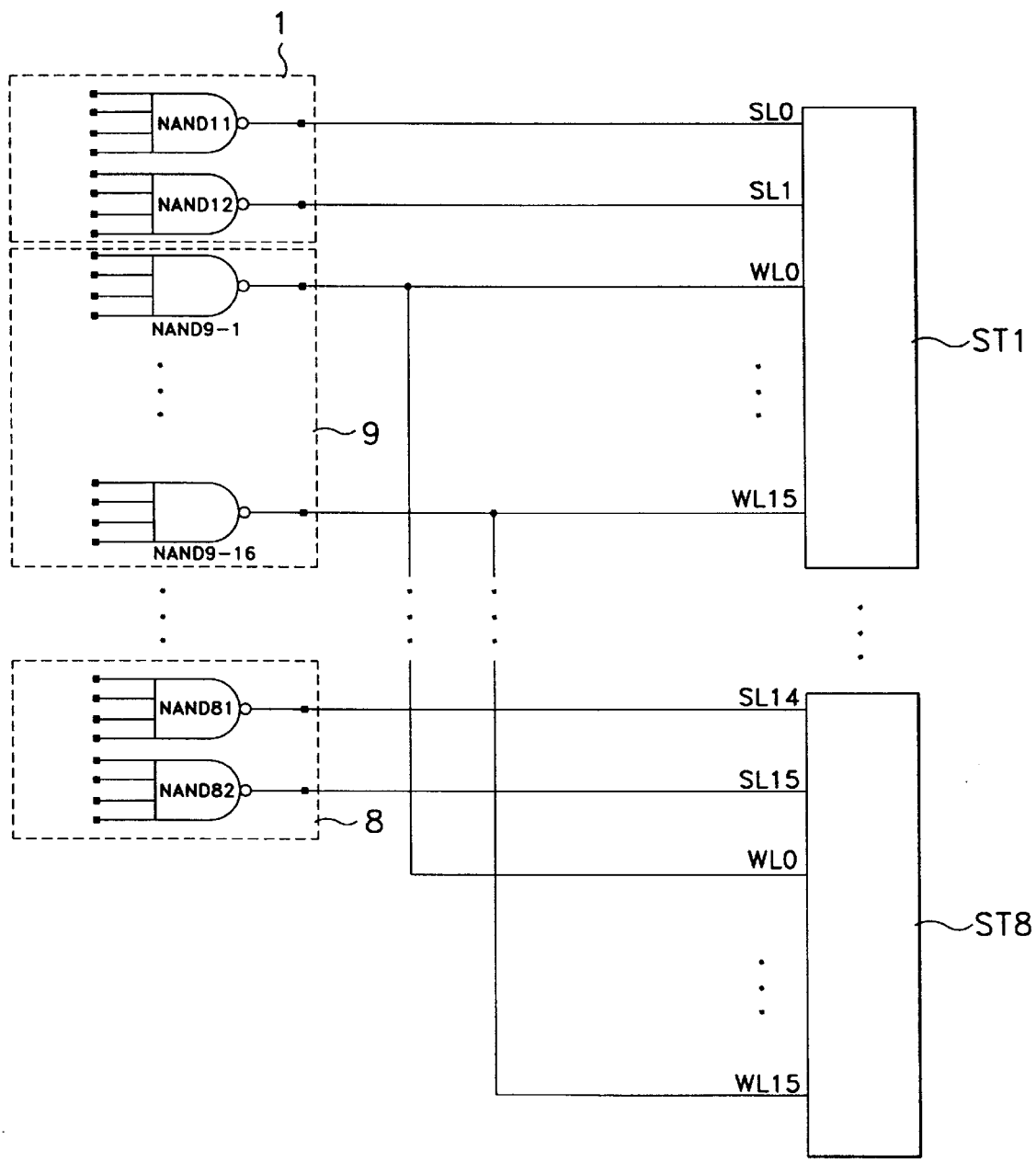
FIG. 1 is a circuit diagram of a conventional row decoder.
Figure 2:
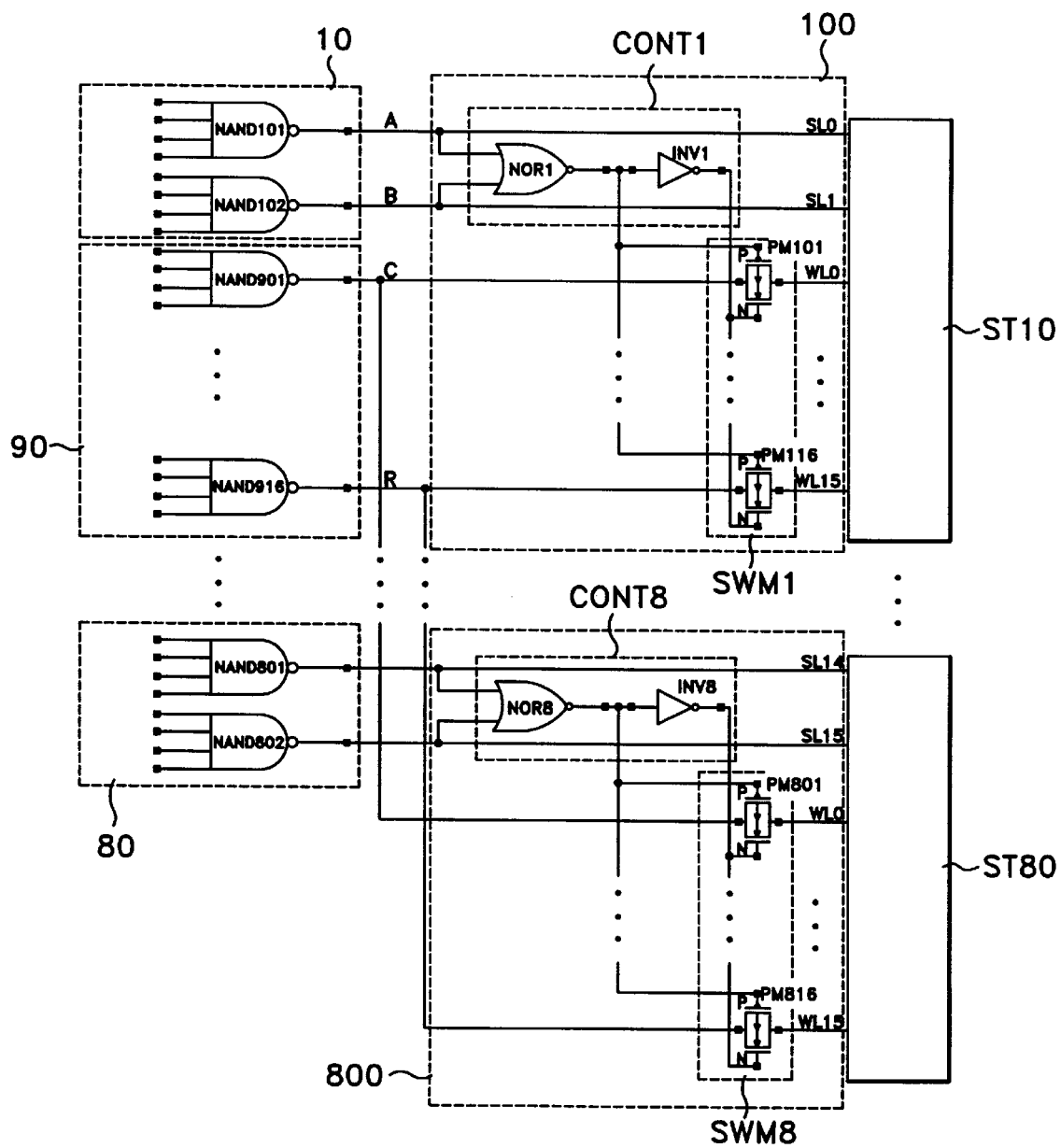
FIG. 2 is a circuit diagram of a row decoder in accordance with the present invention.

FIG. 2 is a circuit diagram of a row decoder in accordance with the present invention. The row decoder of the present invention includes first to eighth selection line decoders 10 to 80 each having a pair of four-input NAND gates, NAND101, NAND102 to NAND801, NAND802, that correspond to a plurality of cell strings, ST10 to ST80, respectively, and that output a signal for selecting a corresponding one of the cell strings ST10 to ST80.

The row decoder of the present invention also includes a word line decoder 90 having sixteen four-input NAND gates, NAND901 to NAND916, corresponding to a plurality of memory cells of eight cell strings, ST10 to ST80, respectively, and each outputting word-line selection signals WL0, WL1, . . . and WL15 used for selecting and driving a corresponding memory cell's word line among the memory cells; and a plurality of switching circuits, 100 to 800, corresponding to cell strings, ST10 to ST80, and transmitting word-line selection signals, WL0 to WL15, which are outputted by the word line decoder 90, to a cell string selected by the selection signal.

Respective switching circuits, 100 to 800, include: control means, CONT1 to CONT8, that produce a control signal upon receiving an output signal of selection line decoders, 10 to 80, corresponding to switching circuits 100 to 800 respectively; and switching means, SWM1 to SWM8, that are enabled by control means CONT1 to CONT8, respectively, and transmit word-line selection signals WL0 to WL15, which are outputted by word line decoder 90, to only a selected cell string among a plurality of cell strings, ST10 to ST80.

The control means, CONT1 to CONT8, in the switching circuits, 100 to 800, include first to eighth NOR gates, NOR1 to NOR8, that respectively perform a NOR operation with respect to each output signal of the selection line decoders, 10 to 80, and output resultant signals as a first control signal; and first to eighth inverters, INV1 to INV8, that invert each output signal of the NOR gates, NOR1 to NOR8, and that output inverted signals as a second control signal, respectively. Each switching means, SWM1 to SWM8, in switching circuits, 100 to 800, is enabled by the first and second control signals of control means CONT1 to CONT8, and transmits word-line selection signals, WL0 to WL15, which are outputted from word line decoder 90, to corresponding memory cells of cell strings, ST10 to ST80, respectively. Each switching means, SWM1 to SWM8, has transmission gates, PM1 to PM16, to which first control signals from the NOR gates, NOR1 to NOR8, and the second control signals from inverters, INV1 to INV8, are applied as gate input signals.

Referring to the operation of the inventive row decoder, two input signals A, B of the switching circuits, 100 to 800, which are output signals of selection line decoders, 10 to 80, to one of select cell strings, ST10 to ST80, do not attain a high level at the same time. However, they may attain a low level simultaneously. In addition, if one of signals A, B is at high level, the other one may be at low level.

The following description concerns the case where the first cell string ST10 is selected.

Four-input NAND gates NAND101, NAND102 of the first selection line decoder 10 that corresponds to first cell string ST10, apply a signal for selecting first cell string ST10 to first switching circuit 100. If the input signals A, B of first NOR gate NOR1 are different from each other in phase, the low-level output signal of first NOR gate NOR1 is input to gate terminals of PMOS transistors P. Simultaneously, the low-level output signal is inverted by inverters, INV1 to IVN8, thus attaining a high level, and is then inputted to gate terminals of NMOS transistors N so that the PMOS transistors P and the NMOS transistors N are turned on. Accordingly, the input terminal of each of the transmission gates, PM1 to PM16, is connected with its corresponding output terminal, so output signals that are produced from output terminals C to R of word line decoder 90 and that are to be inputted to cell string ST10, are transmitted to each input terminal of the cell string ST10 receiving the word-line selection signals, WL0 to WL15.

If all the input signals A, B of the first NOR gate NOR1 attain a low level, the high-level output signal of first NOR gate NOR1 is input to gate terminals of the PMOS transistors P. At the same time, the high-level output signal is inverted by the inverters, INV1 to INV8, to attain a low-level and is inputted to gate terminals of the NMOS transistors N so that the PMOS transistors P and the NMOS transistors N are turned off. Thus, each input terminal of the transmission gates, PM1 to PM16, is disconnected with its corresponding output terminal, so each output terminal, C to R, of word line decoder 90 is disconnected with each input terminal of cell string ST10 receiving word-line selection signals, WL0 to WL15.

The above description relates to first switching circuit 100 corresponding to the first cell string ST10. Since all the switching circuits 100 to 800 have the same construction, in case that any one of the cell strings is selected, switching circuit 100, 200, . . . , or 800 that corresponds to the selected cell string, operates in the same way as that of first switching circuit 100. According, output signals of word line decoder 90 are transmitted to each input terminal of the cell string ST10 to ST80 which is selected for receiving word line selection signals WL0 to WL15.

In the meantime, if input signals A, B of the NOR gate in one of switching circuits 100 to 800 that is connected with the cell string to be selected, are different from each other in phase, signals A, B, input to the rest of switching circuits, each attain a low level in order to select only one of a plurality of cell strings, ST10 to ST80. Therefore, each signal, produced from output terminals C to R of word line decoder 90, is transmitted to the selected cell string through one switching circuit corresponding to the selected cell string. However, in the other switching circuits, output signals of word line decoder 90 are not transmitted to the input terminals of the cell strings not selected. Accordingly, the load applied onto output terminals C to R of word line decoder 90 becomes reduced, thus minimizing power consumption and ensuring high- speed performance.

As described above, the row decoder of the present invention has a power saving function and a large driving capability. Since a lighter load is applied to the output terminals of the row decoder, the size of a buffer that is used to enhance the driving capability is also reduced.

It will be apparent to those skilled in the art that various modifications and variations can be made in the row decoder of the present invention without departing from the spirit or scope of the invention. Thus, it is intended that the present invention cover the modifications and variations of this invention provided they come within the scope of the appended claims and their equivalents.

What is claimed is:

1. In a semiconductor memory device having a plurality of cell strings with a plurality of memory cells, a row decoder for the semiconductor memory device comprising:

plural selection line decoders each corresponding to a corresponding one of the cell strings, each selection line decoder for outputting a cell string selection signal for selecting said corresponding one of the cell strings;

a word line decoder for providing word-line selection signals each used for selecting a corresponding word line of a corresponding memory cell among memory cells of a cell string selected by one of said selection line decoders; and a plurality of switching circuits each corresponding to a corresponding one of the cell strings, for transmitting said word-line selection signals provided by the word line decoder to said corresponding memory cell of only said corresponding one of the cell strings selected by said one of the plural selection line decoders with a corresponding cell string selection signal.

2. A row decoder according to claim 1, wherein each of the switching circuits comprises:

control means for providing a control signal in response to said cell string selection signal from said one of the plural selection line decoders; and switching means respectively enabled by said control signal for said transmitting said word-line selection signals provided by the word line decoder.

3. A row decoder according to claim 2, wherein each of the control means comprises:

a NOR gate for performing a NOR operation with respect to said cell string selection signal from said one of one of the plural selection line decoders and for providing a resultant signal to the switching means as a first control signal; and an inverter for inverting the resultant signal of the NOR gate and for outputting an inverted resultant signal as a second control signal to the switching means.

4. A row decoder according to claim 3, wherein each of the switching means has a plurality of transmission gates enabled by the first and second control signals, for said transmitting said word-line selection signals.

* * * * *